United States Patent [19]
Watkins et al.

[11] Patent Number: 5,155,819
[45] Date of Patent: Oct. 13, 1992

[54] FLEXIBLE ASIC MICROCOMPUTER PERMITTING THE MODULAR MODIFICATION OF DEDICATED FUNCTIONS AND MACROINSTRUCTIONS

[75] Inventors: Daniel Watkins; Yen Chang, both of Saratoga, Calif.

[73] Assignee: LSI Logic Corporation, Milpitas, Calif.

[21] Appl. No.: 651,111

[22] Filed: Feb. 4, 1991

Related U.S. Application Data

[60] Continuation of Ser. No. 404,911, Sep. 8, 1989, abandoned, which is a division of Ser. No. 116,411, Nov. 3, 1987, Pat. No. 4,878,174.

[51] Int. Cl.⁵ .............................................. G06F 9/22
[52] U.S. Cl. ............................ 395/375; 364/DIG. 2;
364/946.6; 364/946.2; 364/946.7; 364/955;
364/955.5; 364/955.6; 364/925.5; 364/927.8
[58] Field of Search ... 364/200 MS File, 900 MS File;
395/375, 775

[56] References Cited

U.S. PATENT DOCUMENTS

| | | | |
|---|---|---|---|
| 3,991,404 | 11/1976 | Brioschi et al. | 364/200 |
| 4,093,982 | 6/1978 | Heuer et al. | 364/200 |
| 4,124,890 | 11/1978 | Vasenkov et al. | 364/200 |
| 4,144,563 | 3/1979 | Heuer et al. | 364/200 |
| 4,153,933 | 5/1979 | Blume et al. | 364/200 |
| 4,155,120 | 5/1979 | Keefer et al. | 364/200 |
| 4,291,372 | 9/1981 | Forbes et al. | 364/200 |
| 4,306,163 | 12/1981 | Blume et al. | 307/475 |
| 4,398,244 | 8/1983 | Chu et al. | 364/200 |
| 4,403,284 | 9/1983 | Sacarisen et al. | 364/200 |
| 4,434,462 | 2/1984 | Guttag et al. | 364/200 |
| 4,443,865 | 4/1984 | Schultz et al. | 364/900 |
| 4,450,519 | 5/1984 | Guttag et al. | 364/200 |
| 4,766,531 | 8/1988 | Huntsman et al. | 364/200 |
| 4,825,363 | 4/1989 | Baumann et al. | 364/200 |

OTHER PUBLICATIONS

Matney, Roy M. et al., *Computer Design*, "Microprogramming for the Masses", Oct. 1983, pp. 241–246.
"Texas Instruments Data Manual TMS 7000 Family", (1989).
Chapter 6 of the 1984 Intel Microcontroller Handbook (Order No. 210918-002), MCS-51 Architecture.

*Primary Examiner*—Kevin A. Kriess
*Attorney, Agent, or Firm*—Skjerven, Morrill, MacPherson, Franklin & Franklin

[57] ABSTRACT

A general purpose architecture for a digital microcomputer, which includes a central processing unit, random access memory, user-defined dedicated functions and an optional programmable read only memory. Instructions are fetched either externally or from the optionally ROM. Data can be fetched externally or internally. Each instruction fetched is interpreted by a general-purpose microengine. The architecture is flexible enough to permit the modular addition, deletion and modification of dedicated functions and microinstructions (including changes in execution timing and decoding), as well as the testing of memory independently from the rest of the architecture.

4 Claims, 2 Drawing Sheets

USER PROGRAM TO SET SECOND LEAST
SIGNIFICANT BIT OF REGISTER "C" IN
DEDICATED LOGIC DEVICE

|  |  | PRIOR ART | FASMIC |
|---|---|---|---|
| MACROINSTRUCTION | 1: | MOV   A, DIRECT | SETB   C. 1 |
| MACROINSTRUCTION | 2: | MOVX  A, AT DP | |
| MACROINSTRUCTION | 3: | SETB  A, 1 | |
| MACROINSTRUCTION | 4: | MOVX  AT DP, A | |
| MACROINSTRUCTION | 5: | MOV   DIRECT, A | |

FLEXIBLE ASIC MICROCOMPUTER PERMITTING THE MODULAR MODIFICATION OF DEDICATED FUNCTIONS AND MACROINSTRUCTIONS

This application is a continuation of application Ser. No. 07/404,911, filed Sep. 8, 1989, now abandoned which is a divisional of application Ser. No. 07/116,411, filed Nov. 3, 1987, now U.S. Pat. No. 4,878,174.

FIELD OF THE INVENTION

This invention relates to the field of digital microcomputers embodied in a single integrated circuit.

BACKGROUND OF THE INVENTION

Although microcomputers (which include, in one integrated circuit, RAM and various dedicated functions, in addition to the central processing unit itself) are well known in the art, the process of designing such devices has been geared toward producing standard off-the-shelf products which generally meet the public's needs. The architectures underlying such devices have not been designed to be customized to fit the needs of particular users. Rather, they have been designed to perform optimally for a predetermined set of macroinstructions.

Examples of such microcomputers include the Intel 8031/8051, the architecture of which is specified in Chapter 6 of the 1984 Intel Microcontroller Handbook (Order No. 210918-002), and the Programmable Single Chip MOS Computer disclosed in U.S. Pat. Nos. 4,153,933 and 4,306,163. From what one can discern from the descriptions of these devices (and all other microcomputer architectures known to the inventors), it is clear that their architectures are rigid and inflexible. Memory sizes for code and data, macroinstruction decoding and timing, and even the available peripheral functions (such as timers/counters and serial controllers), are all predetermined and not capable of change.

This is not surprising given the traditional approach to microcomputer architecture design. As a general rule, the microcomputer user is concerned only with its external interface—e.g., the macroinstruction set and pin definitions, perhaps including the timing required to execute each instruction. In other words, the user is concerned only with which operations the chip performs, not how it performs those operations.

Thus, previous microcomputer architectures consist of minimized logic paths designed to optimize the performance of the device for its predetermined functions. In other words, the microarchitecture is designed with one purpose in mind—executing the specified instruction set as quickly as possible for a given integrated circuit area. No thought is given to the possibility that the same architecture might be reused for a slightly (or perhaps significantly different) application.

As is the case with any "standard device," many potential users would prefer to play a role in the design process itself, and to customize the device to suit their individual requirements. Short of designing a custom microcomputer for each such user, however, there does not currently exist a method of providing users with a customizable microcomputer that suits their individual needs.

An additional problem relates to the testing of that on-chip memory independently from the CPU. When an entire microcomputer (including memory) is fabricated on one integrated circuit, it becomes quite difficult to test the memory independently from the rest of the circuit.

One method of solving this problem is described in U.S. Pat. No. 4,153,933, in which special instructions cause program ROM to be sourced onto the main internal bus, independently of the CPU operation (particularly the program counter). This method, however, still utilizes the main internal bus, necessitating the design of dedicated logic to address the ROM. This dedicated logic is not without costs, both in the speed of normal execution and in silicon area. Even more significantly, when varying memory sizes are permitted, the problems associated with the design of this dedicated logic are exacerbated (because multiple sets of dedicated logic must be created).

SUMMARY OF THE INVENTION

What this invention provides is a general purpose microcomputer architecture that is flexible enough to permit individual users to specify, for example, changes in the definition of macroinstructions, or simply execution timing, as well as the size of on-board memory (whether for data or code). Each user can specify his or her own custom, dedicated logic functions, and have such functions easily incorporated into the macroinstruction set through the internal microcomputer architecture.

This is accomplished by generalizing the components of the architecture, with flexibility and expansion in mind, thereby permitting certain types of additions, deletions and modifications of functionality to be incorporated into the heart of the device itself, rather than simply as an appendage to the integrated circuit. The design of application specific integrated circuits requires more than merely permitting the user to include his or her custom logic on the same integrated circuit as the microcomputer. It must also be the case that the microcomputer and that custom logic no longer communicate simply as external devices. Functionality, as well as chip area, must be integrated at the architecture level.

For example, rather than adding user-specified dedicated logic functions by the traditional method of merely providing external I/O ports, these functions are incorporated into the microarchitecture by also providing means for adding the registers associated with these dedicated functions to the internal register file of the microcomputer. This approach provides significantly greater flexibility, enabling the user to manipulate that custom external device as if it were incorporated within the microarchitecture itself. The user need not specify fixed external memory locations (requiring the reading and writing of values into other scarce internal registers) to perform simple logical and arithmetic operations. The user thus achieves savings in space and performance as well as in the cost of program design.

Significant flexibility is provided with respect to the definition of the macroinstruction set itself. Because the chip is not littered with dedicated "glue" logic designed to optimize a particular set of predetermined macroinstructions, individual macroinstructions can be modified solely by rewriting microcode. Instruction decoding and execution time can also be modified in this manner.

Entirely new instructions can even be added simply by writing additional microcode. Although some user-specified macroinstructions might require additional time to execute than is the case for predefined macroinstructions (because the microarchitecture is only optimized for predefined macroinstructions), many users will accept this tradeoff in speed for the added flexibility of designing custom macroinstructions. After all, the alternative is either to abandon the standard part entirely, or to define the custom macroinstruction by combining predefined macroinstructions (almost certainly a slower and more costly course of action).

Another problem addressed by the FASMIC architecture relates to the testing of on-chip memory independently from the CPU. This invention provides a mechanism for testing on-chip memory, independent of the internal bus (and thus the rest of the integrated circuit), thereby providing a solution which utilizes standard memory addressing logic and avoids the significant extra cost of designing dedicated logic, particularly where variable memory sizes are permitted (according to each user's individual requirements).

The mechanism itself incorporates "scan path circuitry" which has been published in another context. See the LSA2001 Silicon-Gate HCMOS Structured Array data sheet, pp. 8-10, published by LSI Logic Corporation in Mar., 1987 (explained in detail below). This "scan" mechanism has never before been utilized, however, in the context of a microcomputer, in which the testing of memory independently from the main internal bus (and thus the rest of the CPU) is of great significance.

In summary, this invention comprises a digital computer on a single substrate, comprising a bidirectional data bus, memory for the storage of data or code, said memory comprising one or more registers used for the temporary storage of data during the operation of said digital computer, means for addressing said memory, said addressing means comprising means for including the addresses of external device registers, not located on said substrate, within the same address space used for said memory, said means permitting the same degree of direct manipulation of said external registers as is permitted registers located on said substrate, and a central processing unit which interprets and executes macroinstructions, and which performs arithmetic and logical operations, said central processing unit coupled to said data bus, to said memory and to said addressing means, said central processing unit comprising a microengine for controlling the operation of said computer, said microengine comprising macroinstruction memory for storing one or more of the macroinstructions to be executed by said computer, microcode memory, said microcode memory comprising one or more microinstructions, each of said microinstructions comprising one or more control signals to control the execution of said macroinstructions, means for receiving each of said macroinstructions and mapping said macroinstructions into a sequence of microinstructions, said means causing the first microinstruction of said sequence of microinstructions to be executed, and means for sequencing the execution of said microinstructions, and means for generating, independently of the operation of said data bus, the address of memory external to said substrate, and the address of the next of said macroinstructions to be executed by said microengine.

DETAILED DESCRIPTION OF PREFERRED EMBODIMENT

The following description is meant to be illustrative only and not limiting. While the preferred embodiment of this invention is described, other embodiments (which implement different instruction sets, utilize different control means, or contain different dedicated logic functions) will be obvious in view of the following description.

Figure 1:
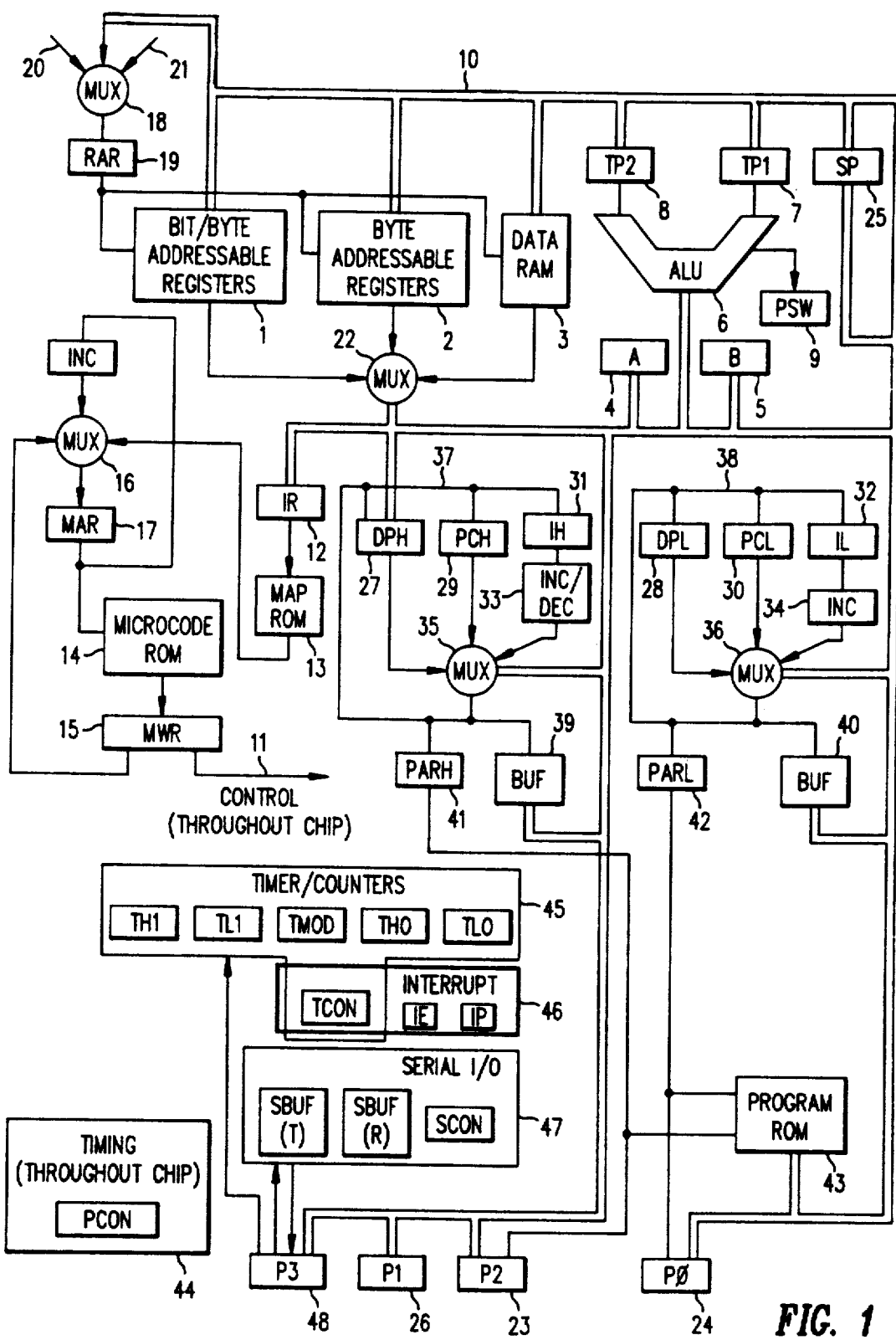
FIG. 1 illustrates the architecture of the FASMIC microcomputer, the preferred embodiment of this invention.

This invention is embodied in the architecture of the Flexible ASIC Microcomputer ("FASMIC") illustrated in FIG. 1. Included are two distinct sets of register blocks, the first block 1 of registers being both bit-addressable and byte-addressable, and the second block 2 of registers being only byte-addressable. Although these registers are illustrated in two distinct blocks in FIG. 1, the registers in both sets are physically located throughout the architecture of this chip (also illustrated in this diagram). The purpose of grouping these registers in blocks 1 and 2 is simply to illustrate the appropriate addressing mechanism associated with each register.

All of the registers in blocks 1 and 2 are accessible both internally, via microcode, and externally, via user macroinstructions. In addition to these special purpose registers, the user is also provided with a set of general purpose registers, included in "scratchpad" Data RAM 3. Two of the special purpose registers, registers A and B (denoted by numerals 4 and 5), are also shown below the ALU 6, which performs well-known arithmetic and logical operations.

The two ALU operands are stored in registers TP1 7 and TP2 8, and various result flags of ALU operations are stored in PSW register 9. All special purpose registers, as well as the ALU and Data RAM 3, are accessible via the Internal Bus 10, from which information can either be read or written.

This particular embodiment of the FASMIC architecture is controlled by a general purpose microengine, which generates control signals 11 which are distributed thoughout the integrated circuit. This microengine includes an instruction register (IR) 12, which initially holds each user macroinstruction after it is fetched from program memory.

This macroinstruction is decoded via the Map ROM 13, which maps each macroinstruction into a starting address (or "entry point") in the Microcode ROM 14. The Map ROM simply contains a table of microinstruction entry points, and is addressed via macroinstruction opcodes. One or more macroinstruction opcodes yields a particular entry point of the first microinstruction in the sequence of microinstructions which interprets that group of macroinstructions.

Note that the functionality of both the Map ROM 13 and the Microcode ROM 14 can easily be manifested, in another embodiment, in either a PLA or purely in logic synthesis (as opposed to a ROM). As a general rule, it makes no difference to the user how this functionality is manifested, provided that the precise functionality is performed within specified size and performance boundaries. The FASMIC architecture is designed to permit significant flexibility by maintaining a binary representation of this functionality, thereby enabling the user to select a particular manifestation (e.g., 64 K ROM) to suit his or her individual space, performance or other requirements.

Residing in the Microcode ROM are the sequences of microinstructions (described in greater detail below) which contain the control signals necessary to interpret particular macroinstructions by causing the rest of the microarchitecture to perform the appropriate functions. These control signals are organized into fields, each field representing a particular function, such as reading a particular register and placing its contents onto the internal bus. These fields are further organized into fixed-length microinstruction formats, each of which constitutes a type of microinstruction containing multiple fields of control signals. Each microinstruction is stored, immediately prior to its execution, in the micro word register (MWR) 15, from which it is decoded by additional control logic distributed throughout the integrated circuit.

The sequencing of microinstruction execution is controlled via MUX 16, which, as a default, simply increments the address to the next sequential microinstruction (because the sequence of microinstructions is generally known for a particular group of one or more macroinstructions). Sometimes, however, the sequencing is conditional—e.g., when a conditional microcode branch occurs. In that case, a particular field of the previous microinstruction itself contains the next address (jumped to if the condition was met). Finally, after the sequence of microinstructions which interpret a particular group of macroinstructions is executed, the next address is determined by the output of the Map ROM, because that address is dependent upon the particular macroinstruction to be executed next.

Thus, MUX 16 determines the address of the next microinstruction to be executed by (1) incrementing the address of the previous microinstruction, (2) using the entry point address generated by the Map ROM or (3) using the branch address generated from or contained within the previous microinstruction (stored in MWR). This address is then stored in the micro address register (MAR) 17 which addresses the Microcode ROM directly, causing the microinstruction at that address to be loaded into MWR and then executed.

Whereas MUX 16 determines the source of the address of the next microinstruction to be executed, MUX 18 determines the source of the encoded "address" of the register to be accessed (e.g., when a microinstruction or a macroinstruction operates on a particular register), and then stores that encoded address in the RAM/Register Address Register (RAR) 19.

The first of the three possible sources for RAR is the Internal Bus 10, containing the absolute address of the register (or RAM location) specified by the currently executing microinstruction itself. These control signals are decoded from MWR, and then placed onto the Internal Bus where they may be used to select a particular register (or RAM location) from which data are read or into which data are written. Additional control signals will, of course, determine whether MUX 18 selects this or one of the other two sources.

The second potential RAR source 20 is also an absolute address, but is derived not from a microinstruction, but from the currently executing macroinstruction. This address is composed of three components. The most significant bits of the address are fixed, indicating the particular offset in Data RAM 3 reserved for general purpose registers. The next most significant bits are determined by certain bits of the PSW, indicating which "bank" of general purpose registers in RAM is currently being accessed. Finally, certain bits of the macroinstruction itself specify which particular register in the current bank of Data RAM 3 registers is being accessed. These three components combine to form an absolute address in Data RAM 3 which, if selected on MUX 18, will be loaded into RAR and used to address the Data RAM 3 register to be accessed.

The third possible RAR source 21 is an address in Data RAM 3 obtained through the following indirect addressing means. Source 20 loads the indirect address into RAR. The contents of RAR are then used as a pointer (the indirect address) into Data RAM 3. The contents of the word at this address in Data RAM 3 (the absolute address) become source 21 into MUX 18, which, if selected, is loaded into RAR.

MUX 22 conceptually illustrates that the data in the register accessed via RAR is obtained from a special purpose bit-addressable register, a special purpose byte-addressable register or a general purpose Data RAM register. In addition to addressing registers, both microinstructions and macroinstructions can access off-chip data RAM via external port P2 23 and port P0 24. The stack pointer register (SP) 25 is used to implement a well-known software mechanism for organizing user memory by saving data in a "last in first out" (LIFO) manner. SP contains the address of the "top" (last in, if the stack grows upward) item on the stack. External port P1 26 is simply a general-purpose parallel port.

External ports P2 23 and P0 24 are utilized to access off-chip program and data memory (RAM or ROM). The address (of the next macroinstruction to be executed) is sent through ports P2 and P0, and is calculated in two physically separate components—one for the most significant half and one for the least significant half of the address. These two components of the "next macroinstruction address generation" mechanism are practically identical.

Each contains three special purpose registers (high and low halves, respectively): (1) the data pointer (DPH 27 and DPL 28), which contains an offset into external data RAM, (2) the program counter (PCH 29 and PCL 30) which contains the address of the next macroinstruction, and (3) an internal register (IH 31 and IL 32) which is normally used as a temporary register for incrementing the program counter to obtain the address of the next sequential macroinstruction to be executed.

Note that the high component of this mechanism contains an incrementer/decrementer 33, while the low component contains simply an incrementer 34. This difference is due to the fact that the low component computes relative address displacements using the ALU, leaving only a minor increment or decrement in the high component, which is handled in hardware via incrementer/decrementer 33.

MUX 35 and MUX 36 receive control signals that determine which of the three registers to access for generating the address. Because this calculation is often complex (requiring, for example, ALU operations), separate internal PD (program counter and data pointer) buses PDH 37 and PDL 38 are employed, to permit data to be transferred among the registers associated with this mechanism and onto the Internal Bus, from which it can be manipulated via the ALU. Buffers 39 and 40 contain the well-known logic mechanism necessary to insure that data is properly transferred between the PD buses and the Internal Bus without any conflict (because the Internal Bus can only be "mastered" by one source at any given time).

Thus, the next macroinstruction address is computed via this mechanism under microcode control (for example, by manipulating data across the PD buses and the Internal Bus, using the ALU to perform any necessary logical and arithmetic operations). External data RAM addresses are also computed via this mechanism.

The address of the next macroinstruction to be executed is stored ultimately in the program address registers (PARH 41 and PARL 42). In addition to fetching the next macroinstruction from off-chip memory (via external ports P2 and P0), some or all of the user's program may be stored in optional on-chip program ROM 43. In any event, this mechanism results either in the reading or writing of external data RAM, or in the fetching of the next macroinstruction (whether from external memory or on-chip ROM), which is then loaded onto the Internal Bus and into IR, whereupon it is executed by the general purpose microengine described above.

Finally, the architecture also includes a Timing mechanism 44 and certain dedicated logic functions (Timers/Counters 45, Interrupt Mechanism 46 and Serial Controllers 47), each of which is well-known in the art and explained in detail in Chapter 6 of the 1984 Intel Microcontroller Handbook (Order No. 210918-002). External port P3 48 provides access to these dedicated functions, which are only tangentially related to this invention, with the exception of the addressing of the external registers of the user-specified dedicated logic functions (incorporated within the address space of the internal registers in blocks 1 and 2).

Figure 2:
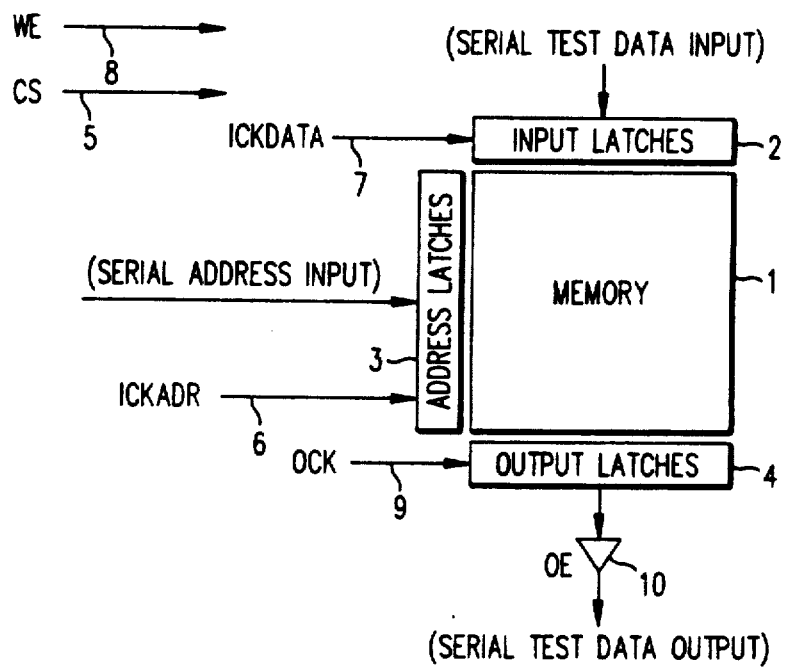
FIG. 2 illustrates the "scan" technique of testing on-chip memory independently of the internal bus.

Illustrated in FIG. 2 is a separate mechanism integrated into the FASMIC architecture which enables the testing of on-chip memory without utilizing the Internal Bus. Note that, rather than designing dedicated memory address logic into the memory, this invention takes advantage of the "scan" technique referred to above, which is already designed into standard memory components.

The Memory itself 1 is surrounded by three sets of latches (Input Latches 2, Address Latches 3 and Output Latches 4), in addition to certain control signals. Once the cell select signal (CS) 5 is reset (disabling the Memory), the serial address bits (addressing the data to be tested, whether read or written) may be loaded into the Address Latches (the width of which is determined by the RAM width, with one latch provided per bit), by strobing the input address clock (ICKADR) 6. Similarly, test data may be input serially into the Input Latches (one per bit of input) by strobing the input data clock (ICKDATA) 7.

By setting CS and the write enable signal (WE) 8 (and holding the internal scan clock signal "low"), test data already strobed into the Input Latches will be written into Memory at the addresses previously strobed into the Address Latches. The same procedure is followed to read test data from Memory, except that WE is reset. The test data is then placed at the inputs of the Output Latches, where it can be latched by strobing the output data clock (OCK) 9 once. Data can then be accessed serially by enabling the output (OE) 10, resetting CS (disabling the Memory) and strobing the internal scan clock until each bit of data has been shifted out.

In this manner, Memory can be tested via the scan mechanism, using only the Input, Output and Address Latches supplied with the Memory itself, thus avoiding the problems resulting from use of the Internal Bus, which would require the creation of dedicated logic.

EXAMPLES OF FASMIC FLEXIBILITY

Addition of Dedicated External Logic

Figure 3:
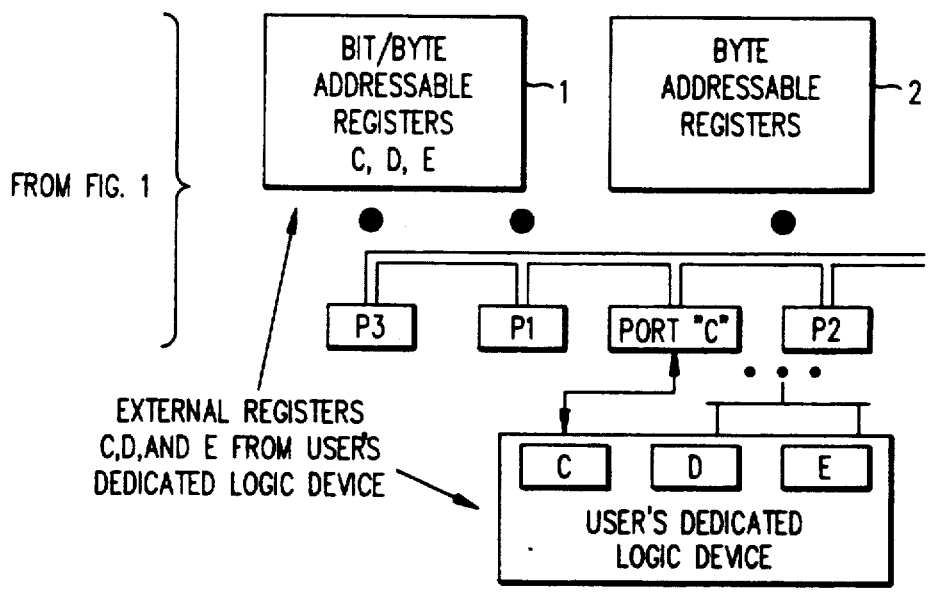
FIG. 3 illustrates how user-specified dedicated logic functions are added to the basic FASMIC architecture.

Looking at FIG. 3, consider the user who desires to add a particular dedicated logic device to the FASMIC architecture that was never contemplated by the FASMIC designers—e.g., a DMA device. Traditionally, that user would have only the access to FASMIC provided at the external ports illustrated in FIG. 1. In the FASMIC architecture, however, the externally-accessible registers of that device are incorporated into the base architecture—i.e., they are included in the set of directly bit-addressable or byte-addressable registers.

The significance of including the external device's registers within FASMIC's internal register address space becomes apparent when the user writes software to control FASMIC. Consider, for example, the common task of setting one bit in a particular register ("Register C") of the dedicated logic device illustrated in FIG. 3 (utilizing, for example, the FASMIC instruction set).

In the FASMIC architecture (because that external register is within FASMIC's internal address space), the program consists merely of one instruction ("SETB C. 1"), which sets the second least significant bit of Register C). If, however, Register C was not included in FASMIC's internal address space (as is the case in all microcomputers known to the inventors), a significantly longer program (consisting of the five macroinstructions illustrated in FIG. 3) would be required.

In essence, the user would have to save, and ultimately restore, a "scratch" register to hold the value read in from external Register C (macroinstructions 1 and 5). Moreover, the user would have to move the contents of Register C into that scratch register (macroinstruction 2) and, after finally setting the bit (macroinstruction 3), move the result back into Register C (macroinstruction 4).

The additional length of this program illustrates the extra programming required each time that an external register is manipulated. If the registers of the user's device are accessed frequently, the user's program would be significantly slower, and occupy significantly more space, than the corresponding program utilizing the FASMIC method.

Such clearly redundant (and frequent) operations as the accessing of external registers are far more efficient if handled internally, rather than forcing the user through the circuitous, and often troublesome, route of saving and restoring limited scratch registers, as well as moving data (rather than concentrating on the important data manipulation macroinstructions which lie at the heart of most computerJprograms).

In essence, by generalizing the FASMIC architecture so as to include external registers within the device's internal register address space, this invention relieves the user of the need to handle excess "data movement" instructions (which often occupy an inordinate percentage of many computer programs), and frees the user to concentrate on the particular task at hand, requiring the use of "data manipulation" (or number-crunching) instructions.

Customization of the Macroinstruction Set

Users often desire to customize the macroinstruction set to suit their individual needs. The FASMIC architecture makes such customization not only possible, but extremely simple.

Consider the user who is offered the common (and usually acceptable) "add with carry" (ADDC) macroinstruction. Briefly, this macroinstruction adds two numbers together and sets the carry bit if the result caused a carry beyond the most significant bit of the result. What if, however, that particular user requires (for some reason) a modified ADDC macroinstruction which always sets the carry bit? Virtually all of the functionality already exists in the machine, but prior art microcomputers leave the user without a feasible solution.

Yet, because FASMIC is designed to be customized for such requests, the microcode simply needs to be modified slightly. Rather than use the carry value generated by the addition operation in the ALU, the microcode simply needs to set the carry bit directly sometime after the addition operation. This slight change in operation for a particular user is possible (without any additional hardware changes) because the FASMIC architecture is designed with this flexibility in mind.

Additional examples abound. The user might desire not simply to modify an existing macroinstruction, but to add an entirely new macroinstruction. Once again, all that is required is a new microcode sequence, and the addition of its entry point in the Map ROM. Compatibility with previous macroinstruction sets is also possible (even at execution time), simply by providing a user-settable switch which causes the "compatible" microroutine to be executed, rather than the current, often faster, routine. The slower speed provides what is often a necessary degree of compatibility.

In short, clearly significant functionality can be obtained by providing the user with a flexible architecture that permits the macroinstruction set to be customized to each user's individual requirements.

We claim:

1. An Application Specific Integrated Circuit (ASIC) microcomputer formed on a substrate, including a macroinstruction memory for storing one or more macroinstructions to be executed by said microcomputer, each of said one or more macroinstructions being predefined so as to be associated with a predefined set of operations to be conducted by said microcomputer, and including a central processing unit which interprets and executes said macroinstructions and which performs arithmetic and logical operations, said central processing unit comprising:
   a microengine for controlling the operation of said microcomputer, said microengine comprising:
   microcode memory containing one or more microinstructions, each of said microinstructions acting to generate one or more control signals to control the execution of said macroinstructions;
   means for receiving each of said macroinstructions and mapping said macroinstructions into a sequence of microinstructions, said means for receiving and mapping causing a first microinstruction of said sequence of microinstructions to be executed, said means for receiving and mapping comprising:
   mapping memory for storing and designating an address in said microcode memory of said first microinstruction to be executed, said mapping memory being addressed by one or more bits of said macroinstruction,
   contents of said mapping memory and contents of said microcode memory being selectable by a user of said ASIC microcomputer to modify the performance of said microcomputer in carrying out any of said one or more predefined macroinstructions, said contents of said mapping memory and contents of said microcode memory being selectable by mask programming said ASIC microcomputer;
   means for sequencing the execution of said microinstructions; and
   means for addressing an address of a next of said macroinstructions to be executed by said microengine.

2. The Application Specific Integrated Circuit (ASIC) microcomputer of claim 1 wherein contents of said mapping memory and contents of said microcode memory are selectable by a user of said ASIC microcomputer to alter the speed by which one or more of said macroinstructions is executed by said microcomputer.

3. An Application Specific Integrated Circuit (ASIC) microcomputer formed on a substrate, including a macroinstruction memory for storing one or more macroinstructions to be executed by said microcomputer, each of said one or more macroinstructions being predefined so as to be associated with a predefined set of operations to be conducted by said microcomputer, and including a central processing unit which interprets and executes said macroinstructions and which performs arithmetic and logical operations, said central processing unit comprising:
   a microengine for controlling the operation of said microcomputer, said microengine comprising:
   microcode memory containing one or more microinstructions, each of said microinstructions acting to generate one or more control signals to control the execution of said macroinstructions;
   means for receiving each of said macroinstructions and mapping said macroinstructions into a sequence of microinstructions, said means for receiving and mapping causing a first microinstruction of said sequence of microinstructions to be executed, said means for receiving and mapping comprising:
   mapping memory for storing and designating an address in said microcode memory of said first microinstruction to be executed, said mapping memory being addressed by one or more bits of said macroinstruction,
   contents of said mapping memory and contents of said microcode memory being selectable by a user of said ASIC microcomputer to add and delete macroinstructions to/from a set of predefined macroinstructions, said contents of said mapping memory and contents of said microcode memory being selectable by mask programming said ASIC microcomputer;
   means for sequencing the execution of said microinstructions; and
   means for addressing an address of a next of said macroinstructions to be executed by said microengine.

4. An Application Specific Integrated Circuit (ASIC) microcomputer formed on a substrate, including a macroinstruction memory for storing one or more macroinstructions to be executed by said microcomputer, each of said one or more macroinstructions being predefined so as to be associated with a predefined set of operations to be conducted by said microcomputer, and including a central processing unit which interprets and executes said macroinstructions and which performs arithmetic and logical operations, said central processing unit comprising:

a microengine for controlling the operation of said microcomputer, said microengine comprising:

microcode memory containing one or more microinstructions, each of said microinstructions acting to generate one or more control signals to control the execution of said macroinstructions;

means for receiving each of said macroinstructions and mapping said macroinstructions into a sequence of microinstructions, said means for receiving and mapping causing a first microinstruction of said sequence of microinstructions to be executed, said means for receiving and mapping comprising:

mapping memory for storing and designating an address in said microcode memory of said first microinstruction to be executed, said mapping memory being addressed by one or more bits of said macroinstruction, contents of said mapping memory and contents of said microcode memory being selectable by a user of said ASIC microcomputer to add and delete macroinstructions to/from a set of predefined macroinstructions;

means for sequencing the execution of said microinstructions;

means for addressing an address of a next of said macroinstructions to be executed by said microengine; and a user-settable switch coupled to said ASIC microcomputer for causing said microengine to carry out a first set of microinstructions in a first switch position and a second set of microinstructions in a second switch position.

* * * * *